(12) United States Patent
Bare et al.

(10) Patent No.: US 10,147,234 B2
(45) Date of Patent: *Dec. 4, 2018

(54) SYSTEM AND METHOD FOR AUGMENTED REALITY DISPLAY OF ELECTRICAL SYSTEM INFORMATION

(71) Applicant: Huntington Ingalls, Inc., Newport News, VA (US)

(72) Inventors: Brian Bare, Newport News, VA (US); Jonathan Martin, Newport News, VA (US); Patrick Ryan, Newport News, VA (US); Paul Sells, Los Angeles, CA (US); Mark Lawrence, Newport News, VA (US)

(73) Assignee: Huntington Ingalls Incorporated, Newport News, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,561

(22) Filed: Jun. 3, 2015

(65) Prior Publication Data

US 2015/0356786 A1    Dec. 10, 2015

Related U.S. Application Data

(60) Provisional application No. 62/036,762, filed on Aug. 13, 2014, provisional application No. 62/025,041, (Continued)

(51) Int. Cl.
     *G06T 19/00*      (2011.01)
     *G01R 31/327*      (2006.01)

(52) U.S. Cl.
     CPC ........ *G06T 19/006* (2013.01); *G01R 31/3274* (2013.01); *G01R 31/3275* (2013.01)

(58) Field of Classification Search
     CPC .............................. G01R 31/327; G06T 19/00
     (Continued)

(56) References Cited

U.S. PATENT DOCUMENTS

| 4,863,268 A | 9/1989 | Clarke |
| 7,852,355 B2 | 12/2010 | Friedrich |

(Continued)

FOREIGN PATENT DOCUMENTS

| WO | WO 2013/023705 | 2/2013 |
| WO | WO 2013/049248 | 4/2013 |
| WO | WO 2014/015378 | 1/2014 |

OTHER PUBLICATIONS

PCT International Search Report, International Application No. PCT/US15/033972, dated Aug. 21, 2015, pp. 1-2.

(Continued)

*Primary Examiner* — Yuehan Wang
*Assistant Examiner* — Michael Le
(74) *Attorney, Agent, or Firm* — Hunton Andrews Kurth LLP

(57) ABSTRACT

A method for providing electrical system status information to a mobile device user is presented. The method comprises receiving a request for target area electrical system status information from a mobile device, determining the pose of the mobile interface device relative to the target area, obtaining target area electrical system status information for a target electrical system at least partially disposed within the target area, and assembling AR electrical system status information for transmission to and display on the mobile interface device. The AR electrical system status information is assembled using the target area electrical system status information and is configured for viewing in conjunction with a real-time view of the target area captured by the mobile interface device. The AR electrical system status (Continued)

information is then transmitted to the mobile interface device.

12 Claims, 8 Drawing Sheets

Related U.S. Application Data filed on Jul. 16, 2014, provisional application No. 61/997,793, filed on Jun. 9, 2014.

(58) Field of Classification Search
USPC .......................................................... 345/633
See application file for complete search history.

(56) References Cited

U.S. PATENT DOCUMENTS

| | | |
|---|---|---|
| 8,248,467 B1 | 8/2012 | Ganick et al. |
| 8,542,906 B1 | 9/2013 | Persson et al. |
| 9,170,766 B2 | 10/2015 | Meier |
| 2002/0075451 A1 | 6/2002 | Ruiz |
| 2002/0191004 A1 | 12/2002 | Ebersole |
| 2003/0210228 A1 | 11/2003 | Ebersole |
| 2007/0050115 A1 | 3/2007 | Discenzo et al. |
| 2007/0081695 A1* | 4/2007 | Foxlin ................... G06T 7/0042 382/103 |
| 2007/0088526 A1 | 4/2007 | Friedrich et al. |
| 2007/0136041 A1* | 6/2007 | Sheridan .................. G09B 9/05 703/8 |
| 2009/0095086 A1 | 4/2009 | Kessler |
| 2009/0215471 A1 | 8/2009 | Sands |
| 2010/0190449 A1 | 7/2010 | Suzuki |
| 2010/0238161 A1 | 9/2010 | Varga |
| 2010/0321389 A1* | 12/2010 | Gay ...................... G11B 27/036 345/427 |
| 2011/0066262 A1* | 3/2011 | Kelly ................. G05B 23/0267 700/90 |
| 2011/0115816 A1* | 5/2011 | Brackney ............... G06Q 10/06 345/629 |
| 2011/0164163 A1 | 7/2011 | Bilbrey |
| 2011/0187744 A1 | 8/2011 | Kim et al. |
| 2011/0216090 A1 | 9/2011 | Woo et al. |
| 2011/0306412 A1 | 12/2011 | Ehara et al. |
| 2012/0001938 A1 | 1/2012 | Sandberg |
| 2012/0015730 A1 | 1/2012 | Watkins, Jr. |
| 2012/0098754 A1 | 4/2012 | Kim |
| 2012/0098859 A1 | 4/2012 | Lee et al. |
| 2012/0218263 A1 | 8/2012 | Meier |
| 2013/0057581 A1 | 3/2013 | Meier |
| 2013/0113827 A1 | 5/2013 | Forutanpour et al. |
| 2013/0113993 A1* | 5/2013 | Dagit, III ................ G06F 3/017 348/552 |
| 2013/0136300 A1 | 5/2013 | Wagner et al. |
| 2013/0154824 A1 | 6/2013 | Cai |
| 2013/0162632 A1 | 6/2013 | Varga |
| 2013/0231779 A1 | 9/2013 | Purkayastha et al. |
| 2013/0253824 A1 | 9/2013 | Yang |
| 2013/0321245 A1 | 12/2013 | Harper |
| 2013/0342568 A1 | 12/2013 | Ambrus |
| 2014/0063055 A1 | 3/2014 | Osterhout |
| 2014/0071163 A1 | 3/2014 | Kinnebrew et al. |
| 2014/0111544 A1 | 4/2014 | Hammond |
| 2014/0118397 A1 | 5/2014 | Lee et al. |
| 2014/0188333 A1 | 7/2014 | Friend |
| 2014/0267417 A1 | 9/2014 | Bare et al. |
| 2014/0280199 A1 | 9/2014 | Bare et al. |
| 2014/0282911 A1 | 9/2014 | Bare et al. |
| 2014/0375816 A1* | 12/2014 | Maihoefer ........... G01C 21/365 348/148 |
| 2015/0029819 A1 | 1/2015 | Yacoubian |
| 2015/0042678 A1 | 2/2015 | Alt |
| 2015/0188984 A1 | 7/2015 | Mullins |
| 2015/0193982 A1* | 7/2015 | Mihelich ............... H04W 4/026 345/633 |
| 2015/0283700 A1 | 10/2015 | Trautman |
| 2015/0294506 A1 | 10/2015 | Bare et al. |
| 2015/0310279 A1 | 10/2015 | Bare et al. |
| 2017/0132799 A1 | 5/2017 | Yajko |

OTHER PUBLICATIONS

International Search Report of the International Searching Authority issued in PCT/US2015/044838, dated Nov. 12, 2015 (2 pages).
Hammad, "Distributed Augmented Reality for Visualising Collaborative Construction Tasks", Journal of computing in civil engineering, No. 6, Oct. 15, 2009, pp. 171-183.
Chen et al., "A Smart Crane Operations Assistance System Using Augmented Reality Technology", Proceedings of 28 Internation Symposium on Automation and Robotics in Construction, 2011, pp. 643-649.
International Search Report of the International Searching Authority issued in PCT/US2015/040562, dated Oct. 15, 2015 (2 pages).
International Search Report of the International Searching Authority issued in PCT/US2015/025784, dated Jul. 20, 2015 (2 pages).
International Search Report of the International Searching Authority issued in PCT/US2015/025734, dated Jul. 30, 2015 (2 pages).
Yacoubian, U.S. Appl. No. 61/857,391 of 2015/0029819, filed Jul. 23, 2013, pp. 1-27.
Yajko, U.S. Appl. No. 61/951,603 of 2017/0132799, filed Mar. 12, 2014, pp. 1-46.

* cited by examiner

SYSTEM AND METHOD FOR AUGMENTED REALITY DISPLAY OF ELECTRICAL SYSTEM INFORMATION

CROSS-REFERENCE TO RELATED APPLICATIONS

This application claims priority to U.S. Provisional Application Nos. 61/997,793, filed Jun. 9, 2014; 62/025,041, filed Jul. 16, 2014; and 62/036,762, filed Aug. 13, 2014, the complete disclosures of which are incorporated herein by reference in their entirety. The disclosure of the present application is also related to the disclosures of U.S. Pub. No. 2015/0294506 (U.S. application Ser. No. 14/686,427), filed Apr. 14, 2015 and U.S. Pub. No. 2015/0310279 (U.S. application Ser. No. 14/695,636), filed Apr. 24, 2015 (now U.S. Pat. No. 9,734,403), both of which are incorporated herein by reference in their entireties.

BACKGROUND OF THE INVENTION

This application relates generally to the use of augmented reality to provide information and direction to users operating in or manipulating dynamic environments and, more particularly, to the use of augmented reality to present electrical system status information to a user in real time.

Augmented reality (AR) provides a view of a physical, real-world environment whose elements are augmented (or supplemented) by computer-generated sensory input such as sound, text, graphics, or video. In a typical AR application, a data processor reviews a camera-captured image for cues that trigger the display of additional information and images along with a display of the captured image.

While AR is useful for conveying information via a static display, it is particularly useful in dynamic situations and environments where images are captured and displayed in real-time and the information to be displayed using AR (hereinafter, "AR information") changes. The ability to provide constant update to the AR information in response to changes in the environment and location and relative positioning of the user's display provides great utility in various applications including construction, repair, maintenance, and safety.

A particularly significant example of a dynamic spatial environment is the space on board a large ship. Not only does the ship itself move, its structure is flexible so that the position of a particular compartment or supporting structure in one part of the ship may change relative to other parts of the ship. Similar dynamic behavior can occur in tall buildings, construction sites, outdoor processing plants, roadways, bridges, etc.

When operating in any of these dynamic environments, safety is a primary focus, particularly when it comes to operating, testing, and maintaining medium voltage switchgear. This has become especially significant in naval vessels because, as such vessels transition away from steam driven equipment to more electrically driven auxiliaries, the demand for power continues to increase. As a result, electric plant technology has also progressed, making it possible to operate shipboard electrical distribution systems at higher voltages. The availability of higher voltage power has made it feasible to utilize equipment that operates at higher voltages, while keeping cable systems relatively small in diameter due to lower currents. However, because the level of experience in handling medium voltage (15 kV) on naval vessels is fairly low, incorporating extensive training and safety features has become especially important due to the perception that there is greater lethality at higher operating voltages. For the worker responsible for operating the switchgear and performing tests to assure that it is operating within prescribed operating parameters, the greatest threat to safety occurs during testing when the worker may be exposed to energized areas of the switchgear without being able to visualize vacuum circuit breaker (VCB) and electrical bus energization state.

To provide the necessary assurance that each operator is highly proficient at operating and maintaining medium (or higher) voltage switchgear, is able to recognize potential hazards, and to operate switchgear safely through all of the required system alignments, each operator is required to undergo hours of training both on energized and de-energized equipment. In its normal functioning state, each bank of switchgear cubicles typically has at least one human machine interface (HMI). This may consist of a flat panel display where the operator can call up the status of various portions of the switchgear and visualize that status on the flat panel display screen. The HMI provides a graphical user interface to allow operators to easily determine system parameters (voltage, current, etc.), VCB status (open/closed/connected/test/withdrawn), and relay status (OK, alarm, warning, etc.). This user interface allows the operator to open and close any of the VCBs in the switchboard/switchboard group.

Normally, when an operator enters the switchgear room on a vessel, an HMI is located on the front face of one of the switchgear cubicles, although it may also be remotely located. The cubicle that the operator has to service may be several cubicles down a line of switchgear cubicles, putting the operator in a position that is not within the line-of-sight of the HMI display. Information that the operator would normally have access to through the HMI is therefore no longer available to him visually.

While in the switchgear room and particularly while operating the gear during normal or training operations, an operator may be required to wear personal protective equipment (PPE). He may be required to wear a hooded covering with a front facing visor which limits his peripheral vision. The visor may be a passive lens which is UV- and IR-coated, and tinted to protect the operator's eyes from arc flash, further obscuring the ability to read the energization status of portions of the equipment. Additionally, switchgear tends to give off a significant amount of sensible heat when operating and is generally in a space or environment that is conditioned for the equipment and not necessarily for human comfort. The lighting in the switchgear room may also be optimized around the minimum acceptable lumens to keep wattage low, thereby minimizing heat load into the switchgear space.

Under these circumstances, it is extremely important for the safety of the operator that a mechanism is provided to assure that he is able to determine electrical system parameters that will allow him to avoid the potential dangers that exist inside the switchgear cubicles. Mechanically operating a VCB bypasses protection, and exposes the operator and equipment to potential hazards that could lead to electric shock to personnel and/or equipment damage.

Clear, rapid communication of changes in electrical system operating parameters to individuals operating such environments is essential.

SUMMARY OF THE INVENTION

An illustrative aspect of the invention provides a method for providing electrical system status information to a mobile interface device user in a dynamic structural environment. The method comprises receiving on a central data processor from the mobile interface device over a communication network a request for target area electrical system status information. The request includes information usable by the central data processor to determine the pose of the mobile interface device relative to a target area in the dynamic structural environment. The method further comprises determining the pose of the mobile interface device relative to the target area. The method still further comprises obtaining target area electrical system status information for a target electrical system at least partially disposed within the target area and assembling AR electrical system status information for transmission to and display on the mobile interface device. The AR electrical system status information is assembled using the target area electrical system status information and is configured for viewing in conjunction with a real-time view of the target area captured by the mobile interface device. The AR electrical system status information is then transmitted to the mobile interface device.

Another illustrative aspect of the invention provides an automated system for providing electrical system status information to a mobile interface device in a dynamic structural environment. The system comprises at least one mobile interface device configured for variable disposition within the dynamic structural environment, capturing information about a target environment within the structural environment, and transmitting the target area information over a network. The system also comprises a local positioning system in communication with the at least one mobile interface device via the network and configured to provide information usable to determine a mobile interface device pose. The mobile interface device pose comprises a position and orientation of the mobile interface device relative to the dynamic structural environment. The system further comprises a central processor comprising at least one data processing machine in communication with the at least one mobile interface device and the local positioning system via the network. The central processor is configured for receiving from a requesting one of the at least one mobile interface device a request for target area environment electrical system information. The request includes information usable to determine the pose of the requesting mobile interface device relative to the target area. The central processor is further configured for determining the pose of the requesting mobile interface device relative to the target area. It is also configured for obtaining target area electrical status information for one or more components of an electrical system at least partially disposed within the target area and assembling AR electrical system status information for transmission to and display on the requesting mobile interface device. The AR electrical system status information is assembled using the target area electrical status information and is configured for viewing in conjunction with a real-time view of the target area captured by the requesting mobile interface device. The central processor is also configured for transmitting the AR electrical system status information to the requesting mobile interface device.

BRIEF DESCRIPTION OF THE DRAWINGS

The invention can be more fully understood by reading the following detailed description together with the accompanying drawings, in which like reference indicators are used to designate like elements, and in which.

DETAILED DESCRIPTION OF THE INVENTION

The present invention provides methods and systems for real-time display of AR information on a mobile device immersed in and movable within a dynamic environment. The challenges presented by this scenario include determination of the location of and orientation of the mobile device within the environment, recognition of variations in the spatial geometry of the environment, and detection/identification of changes in other measurable parameters associated with the environment or objects within the environment.

While the invention will be described in connection with particular embodiments, it will be understood that the invention is not limited to these embodiments. On the contrary, it is contemplated that various alternatives, modifications and equivalents are included within the spirit and scope of the invention as described.

While the dynamic structural environments used in many of the examples and illustrative embodiments used herein to describe the invention relate to ships and other vessels, it will be understood that the invention is not limited to such environments. The invention can be used in, without limitation, land vehicles, buildings and any other static or dynamically variable structure.

The systems of the invention use AR as the primary medium for presenting environment-related information to a user. AR allows presentation of such information on the mobile interface device in graphical or textual form overlaid or adjacent an environmental area or object as it appears in the camera-generated view on the device screen.

Figure 1:
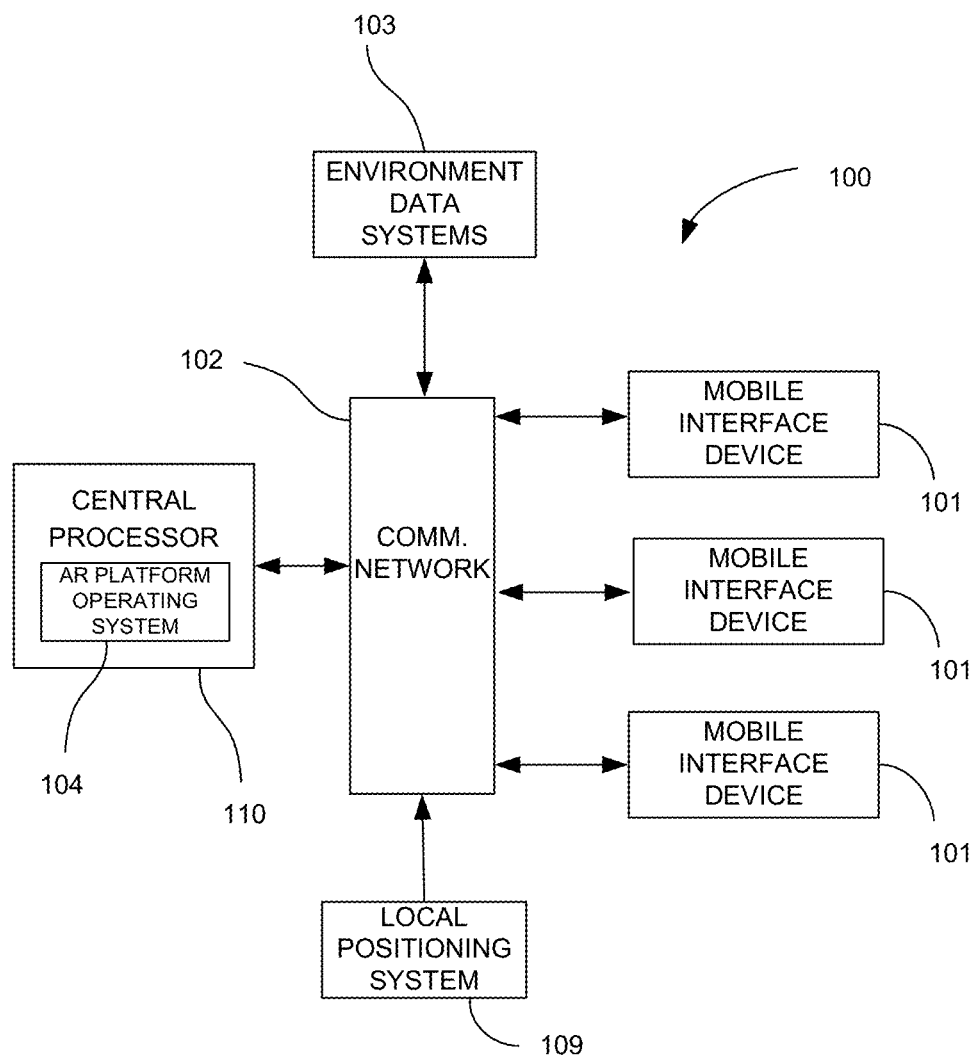
FIG. 1 is a schematic representation of a system for providing environment information to a mobile interface device according to an embodiment of the invention.

A generalized system 100 for generating and displaying real-time AR information according to an embodiment of the invention is illustrated in FIG. 1. The system 100 is configured for obtaining and storing information on a dynamic structural environment such as a ship or building and objects disposed within that environment. The system 100 comprises a central processor 110 in communication with one or more mobile interface devices 101 via a communication network 102. The central processor may include or be in communication with a relational database structure (not shown) as is described in U.S. patent application Ser. No. 14/210,650 (the "'650 application), filed on Mar. 14, 2014, the complete disclosure of which is incorporated herein by reference in its entirety. In general, the central processor 110 is configured to receive captured object information from the mobile interface devices 101 and to extract information relating to the environment or an object in the environment, generate AR information for display on a requesting mobile interface device, and transmit the AR information to the requesting mobile interface device 101.

The central processor 110 may include or be configured to receive information from a local positioning system 109 via the communications network 102 or a different network. The central processor may be configured to use the information from the local positioning system 109 in conjunction with information from a requesting mobile interface device 101 and known/stored structural information (e.g., a three dimensional model) to determine the pose of the mobile interface device 101 within the environment. As used herein, "pose" means the position (x,y,z) and orientation (θ,φ,ζ) of an object in a particular physical space. The system is configured to resolve spatial differences between the coordinate system established based on the known structural information and the data received from the local positioning system 109 that result from changes in the dynamic structure.

The central processor 110 is also configured to receive information from one or more environment data systems 103 via the network 102 or another network. The environment data system 103 is configured for measurement or determination of parameters associated with the structural environment or an object or objects within the structural environment. As will be discussed in more detail, such parameters may include, but are not limited to spatially mapped or mappable data obtained from sensors (e.g., radiation or temperature sensors) with known locations in the structural environment, spatially mapped or mappable data (e.g., weight distribution or surface topography) associated with a particular object in the environment, and system or device status information (e.g., electrical circuit energization status). The central processor 110 is configured to process this information and use it with the pose information for the requesting mobile interface device 101 to generate AR information that can be transmitted to the mobile interface device 101 for display.

In various embodiments of the invention, information processed by the central processor 110 may include asset location information from a global or local positioning system, visual or graphical information received from the mobile interface devices, observational information from users, and operational or other data from instrumentation systems associated with the environment or particular assets. Any or all of such information can be used by the central processor 110 to update object-related information and/or generate information for display via AR images that can be superimposed on the mobile device user's view of the environment or an object in the environment. The mobile interface devices used in the systems of the invention can make use of AR in a variety of ways that allow the user to conduct inspection, maintenance, repair, and replacement tasks in relation to particular assets. AR can also be used to assist a user in identifying safety hazards, locating objects, or simply navigating within the dynamic environment.

The mobile interface device 101 may be any mobile computing solution that is used by a user to facilitate communication with and display information from the central processor 110. The mobile interface device 101 may be, for example, a tablet computer, a smartphone, or a wearable heads-up display. The mobile interface device 101 may have features including, but not limited to a processor, a display (such as a screen), a vision sensor (such as a camera), a microphone, one or more speakers, and wireless communications capabilities. The mobile interface device 101 may be, in a particular embodiment, a wearable head-mounted device (HMD) such as that described in U.S. application Ser. No. 14/210,730, filed Mar. 14, 2014, the complete disclosure of which is incorporated herein by reference in its entirety. In preferred embodiments, the mobile interface device 101 is equipped or configured to display AR images/information to a user. The mobile interface device 101 may include one or more accelerometers or other motion detection sensors. Each mobile interface device 101 may include one or more unique identifiers. In some embodiments, some or all of the mobile interface devices 101 may include one or more local positioning receivers, image and object recognition, audio queues, or electromagnetic field (EMF) receivers or detectors (for GPS, WiFi, or RFID reception or light detection).

The communication network 102 may be a wireless network, a wired network or any combination of wireless network and wired network. In a preferred embodiment, the communications network 102 is a wireless communications network, allowing the mobile interface devices 101 to communicate wirelessly with the central processor 110. The communication network 102 may, in particular, be or include a wireless LAN, a Global System for Mobile Communication ("GSM"), a Personal Communication Service ("PCS"), a Personal Area Network ("PAN"), D-AMPS, Wi-Fi, Fixed Wireless Data, IEEE 802.11a, 802.11b, 802.15.1, 802.11n and 802.11g or any other wired or wireless network for transmitting and/or receiving a data signal.

The central processor 110 may be or comprise one or more servers, data processing machines, or network-enabled computers and may host an AR operating system 104. The AR operating system 104 may be configured to control the interaction of the hardware and software components of a relational database structure (not shown). The relational database structure is configured to provide a logical framework that allows digital information to be associated with physical objects. This framework includes addresses for both tangible objects as well as individual point addresses within a coordinate system for the structural environment. In an exemplary embodiment, this coordinate system is based on a three dimensional (3D) structural model of the environment (e.g., the ship or building). Preferably, the 3D model provides a complete detail of the environment including every space, room or compartment where objects may be disposed.

The AR operating system 104 is configured to assemble AR information for transmission to and display by the mobile device 101. The AR information is constructed using the processed environment data from the environment data systems 103 and the pose of the mobile device 101 using any of various techniques known in the art. The AR information may be presented for display as text or as graphical images that can be superimposed over real-time images captured by the mobile device 101. The AR information may be associated with specific parameters relating to the portion of the environment where the mobile device 101 is located or relating to an object or system near the mobile device 101 and/or with which the user of the mobile device 101 is interacting.

The central processor 110 may be configured or may comprise a processor or processing module and computer executable software (e.g., on a tangible computer-readable medium) configured to perform various processing functions relating to object recognition, including feature extraction to extract lines, edges, ridges, or other localized interest points from an image; detection or segmentation to select a specific set of interest points within an image or segment multiple image regions that contain a specific object of interest; image recognition to categorize a detected object into a particular category; noise reduction; contrast enhancement; and/or space scaling, for example.

The relational database structure may include a domain coordinate management system that maintains spatial addresses for all spaces within the domain of the structural environment. The domain coordinate management system may be configured to receive spatial address information from both the local positioning system 109 and from the three dimensional structural model. The domain coordinate management system is configured to resolve spatial differences between the coordinate system established by the 3D model of the structure and any available telemetry data received from the local positioning system 109 as a result of changes in the dynamic structure. Such differences may be particularly significant in, for example, a large vessel underway at sea. Ships (particularly large ships) are not rigid bodies.

The local positioning system 109 is a system (complete or composite) that facilitates the establishment or estimation of the pose of a mobile interface device 101 within the coordinate system described or approximated by the three dimensional model of the structural environment. As is discussed in more detail in U.S. Pub. No. 2014/0267417 (U.S. application Ser. No. 14/210,601), filed Mar. 14, 2014 (now U.S. Pat. No. 9,865,087) (the "'087 patent"), the complete disclosure of which is incorporated herein by reference in its entirety, pose may be accurately established using vision science-based algorithms. Such algorithms may recognize one or more unique pre-identified visual tracking cues within a physical space.

The local positioning system 109 may be or include any system capable of establishing the position and/or orientation of a mobile interface device relative to a structural environment coordinate system. This coordinate system may be, or may be based on, for example, a predetermined reference system for a ship or other structure. In some embodiments, the local positioning system 109 may comprise a light positioning system that operates by using light points positioned throughout the physical spaces of the vessel. An example of a light positioning system is described in U.S. Pat. No. 8,248,467, the complete disclosure of which is incorporated herein by reference in its entirety. In some embodiments, the local positioning system 109 may use electromagnetic or sound waves emanating from various points within the physical spaces in the structural environment. Examples of electromagnetic or sound waves include radio frequency identification (RFID) signals, radio signals, WiFi signals, audio tones, and/or sound waves. The local positioning system 109 may use unique images or recognizable visual features, quick response (QR) codes, bar codes, or reference points placed throughout the physical space of the structure.

The system 100 may use information from more than one local positioning system. Alternatively or in addition, the system 100 may receive and use information from a global positioning system (GPS) (not shown).

It will be understood that various processing components of the system 100 may be combined into a single processor or further subdivided into multiple processors or servers. It will be appreciated that in some cases, multiple instances of a particular component of the system 100 may be used. Moreover, the system 100 may include other devices not depicted in FIG. 1.

Figure 2:
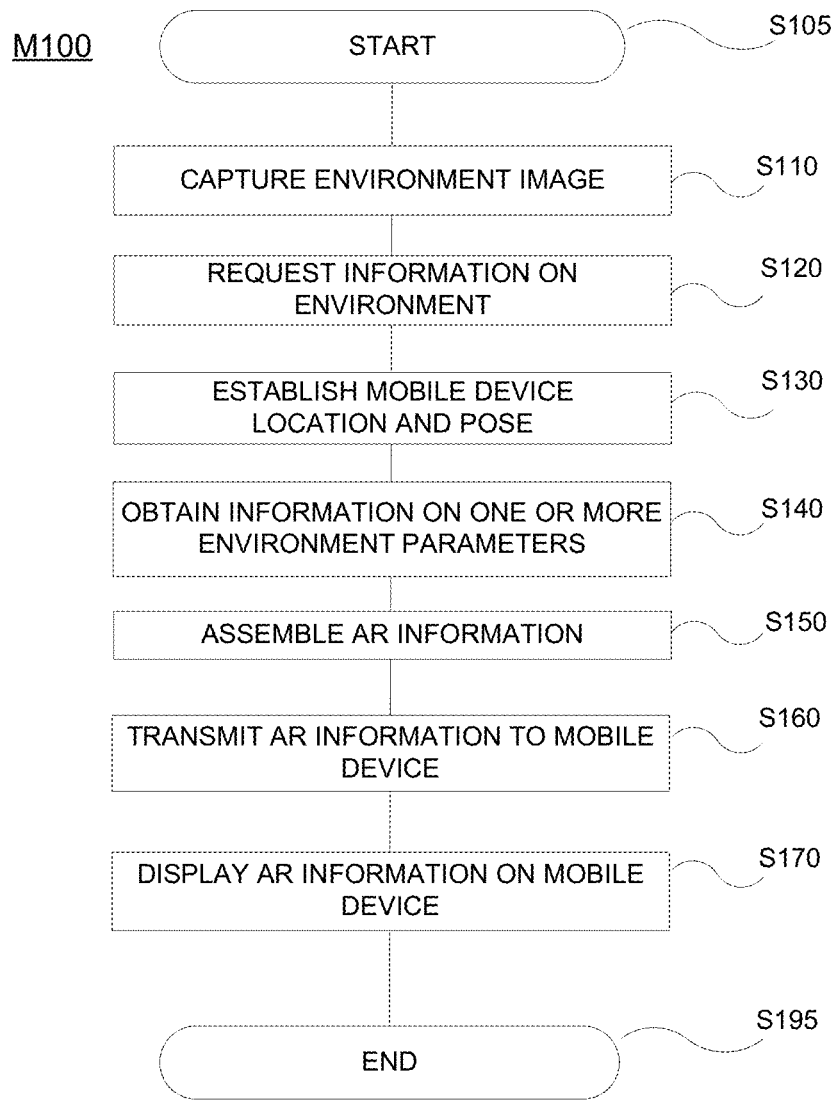
FIG. 2 is a flow diagram of a method of providing environment information to a mobile interface device in a dynamic structural environment according to an embodiment of the invention.

The system 100 can be used to provide mobile device users with real-time AR information on changing environmental parameters or object characteristics. With reference to FIG. 2, a generalized method M100 for providing such AR information to a mobile device user begins at S105. At S110, the user uses the mobile interface device 101 to capture a digital image of a target environment, which may be a portion of the environment in which the user is disposed and/or a target object in that environment. At S120, a request for target environment information is sent from the mobile interface device to a central processor 110 over a network 102. The request includes information usable by the central processor to determine the exact location and pose of the mobile interface device 101 relative to the target environment. This information may include some or all of the digital image. At S130, the central processor 110 uses the request information along with information from the local positioning system 109 to establish the exact location and pose of the mobile device 101 relative to the target environment.

At S140, the central processor 110 obtains environment information on one or more environment or target object-related parameters from one or more environment data systems 103. Such information may be raw data from sensors located in areas near the mobile interface device 101 or on or associated with the target object. The information may also be or include information on the status of a system with which the mobile device user may be required to interact. It will be understood that the information from the environment data systems 103 may be provided to the central processor 110 on a constant basis or may instead be provided in response to a request or query submitted by the central processor 110. At S150, the central processor 110 uses the environment information to assemble AR information for transmission to the mobile interface device 101. This action may include processing of raw data from the environment data systems into a form usable by the AR operating system 104 to construct the AR information. In some embodiments, the AR information includes a graphical representation of target environment parameters as a visual display that can be superimposed over a real-time view of the target environment captured by the mobile interface device 101. At S160, the central processor 110 transmits the AR information to the mobile interface device 101 where it is displayed to the mobile device user at S170. The method ends at S195.

As previously discussed, the AR information may be presented as text displayable in conjunction with the visual display of the environment or target object or as graphical imagery that can be superimposed over an appropriate portion of the visual display. The graphical imagery could, for example, be or include one or more graphical representations of the parameters measured by the environmental data systems or of a condition of the environment associated with such parameters.

It will be understood that, once requested, some or all of the actions of the method M100 may be repeated to periodically or continuously provide real-time environment information to the mobile interface device 101. This assures that the user is aware of variations due to changes in conditions including but not limited to: the user's location, the overall structural environment, the measured environment parameters, or combinations of the foregoing.

The methods of the invention are usable by individuals conducting virtually any operation within a dynamic environment. Of particular interest are uses in which real-time display of immediately recognizable cues increase the safety of a user in a potentially dangerous environment.

As discussed above, one particularly dangerous operational environment is a workplace containing electrical hazards. Real-time communication of changes in electrical system status is critical to safe operations. Toward that end, the present invention provides systems and methods for presenting electrical system status information to a user in real-time using AR. A particular aspect of the invention provides for the information to be conveyed to the user using an augmented reality display superimposed over a real-time, camera-captured image of electrical equipment. This aspect may be referred to as an Augmented Reality Electrical System Status (ARESS) display and provides an essential safety element for a switchgear operator or the operator of any electrical equipment: real-time visual awareness of energization status, voltage level, and other operational parameters.

It will be understood that while the invention is presented herein with reference to its use in shipboard applications, it may be applied to any electrical system used in any land, sea, or air environment, whether fixed or mobile.

Figure 3:
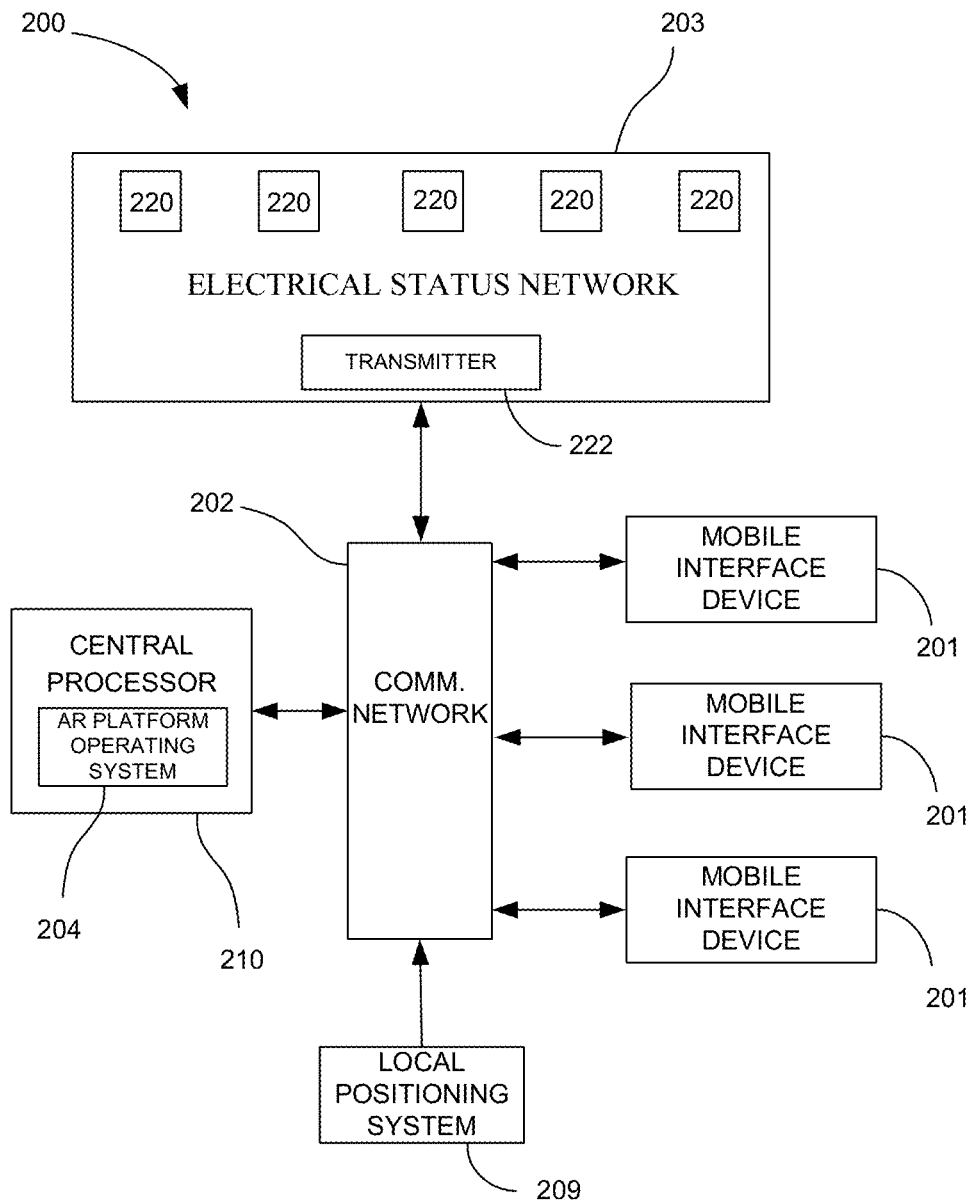
FIG. 3 is a schematic representation of a system for providing electrical system status information to a mobile interface device according to an embodiment of the invention.

FIG. 3 illustrates a system 200 for providing electrical system status according to an embodiment of the invention. The system 200 is essentially a specific variation of the generalized AR environment display system 100 of FIG. 1. It is noted that system 200 illustrates only a single instance of each component. It will be appreciated that multiple instances of these components may be used and that the system 200 may include other devices not shown in FIG. 3. It will be understood that in many environments, the system 200 will interface with other systems such as, for example, the operating system of a shipboard operations and maintenance platform as described in the '650 application.

The system 200 comprises a central processor 210 in communication with one or more mobile interface devices 201 via a communication network 202. The mobile interface device 201 may be any mobile computing solution that is integratable into the system. The mobile interface device 201 may be, for example, a tablet computer, a smartphone, or a wearable heads-up display. The central processor 210 may include or be in communication with a relational database structure (not shown) as described in the "'650 application. The central processor 210 may be configured to receive information from a local positioning system 209 via the communications network 202 or via a different network.

The central processor 210 is also configured to receive electrical system status information via the network 202 (or another network) from one or more electrical status network 203. The electrical status network 203 may be any one or more electrical status networks that is part of or in communication with an electrical system and is configured for transmitting the energization state of some or all of the system's bus work, breakers or other components discretely or continuously. An electrical status network 203 may be, for example, a Supervisory Control and Data Acquisition (SCADA) network that receives electrical status parameters from analog or digital monitoring devices 220 such as protective relays. The electrical status network 203 may use any of a number of transport and network protocols such as MODBUS or PROFIBUS. The electrical status network 203 may use one or more translators to convert the status data into digital signals compatible for standard transmission over the communication network 202. Alternatively, information from the electrical status network 203 may be transmitted to the central processor 210 for further processing and/or retransmission to the mobile interface device 201. The electrical status network 203 may communicate directly with one or more mobile interface devices 201 by transmitting status in real time or near real-time over the communication network 202. Data assurance may be addressed by utilizing a data validation process to assure that data provided by the electrical status network 203 is the most current. Data may be checked for accuracy by comparing values from redundant sources (e.g., automated comparison of data from redundant sensor devices 220).

The electrical status network 203 may provide status information automatically continuously or at regular intervals or manually upon command. The network 203 may include a data processing machine (not shown) for processing the sensor data prior to transmission to the central processor 210 or mobile devices 201 or may provide unprocessed data. In each case, sensor data is associated with the location of the monitoring device 220 within the electrical system environment to allow the system 200 to establish the status in areas of interest relative to the location of any particular mobile interface device 201. The electrical status network 203 may be configured with a transmitter 222 to transmit electrical system status information to the central processor 210 or the mobile devices 201 over the communications network 202.

As will be discussed in more detail hereafter, information captured by the mobile interface device 201 can be used to determine a location of the mobile device user and to identify the target equipment (e.g., a particular switchgear cubicle) of interest to the user. The system 200 can then provide the user with a static display showing the cubicle location based, for example, on the cubicle's specific Internet Protocol (IP) address on the network and/or other specific information for the target equipment including, but not limited to, the energization state of breakers and breaker busses associated with the target equipment. The user can then follow established protocol to perform test sequences at the equipment location with the assurance that the equipment is in a safe condition for performing such tests.

As will also be discussed, a worker using a mobile interface device 201 may be provided with a 3-dimensional representation of electrical status information superimposed over a real-time camera view of the equipment using augmented reality display techniques. This 3-dimensional augmented image is provided to a worker in the correct pose, thus allowing the worker to verify that he is in the correct cubicle and to visualize in real-time or near real time the current status of breakers and busses without the need to make field measurements or to rely on an HMI that may be out of his field of vision.

While this disclosure primarily discusses the use of the invention with respect to switchgear cubicles, it will be understood that the methods of the invention may be extended to any type of electrical system, subsystem, or component.

Figure 4:
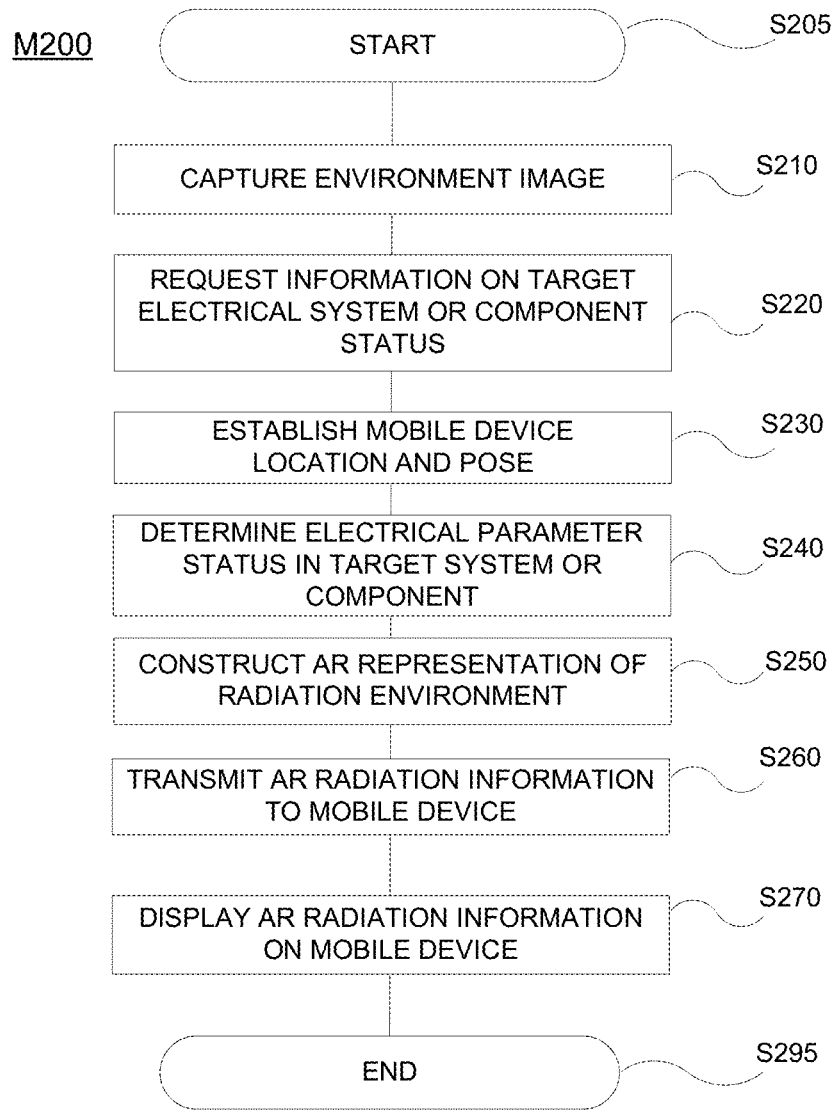
FIG. 4 is a flow diagram of a method of providing electrical system status information to a mobile interface device in a dynamic structural environment according to an embodiment of the invention.
Figure 5:
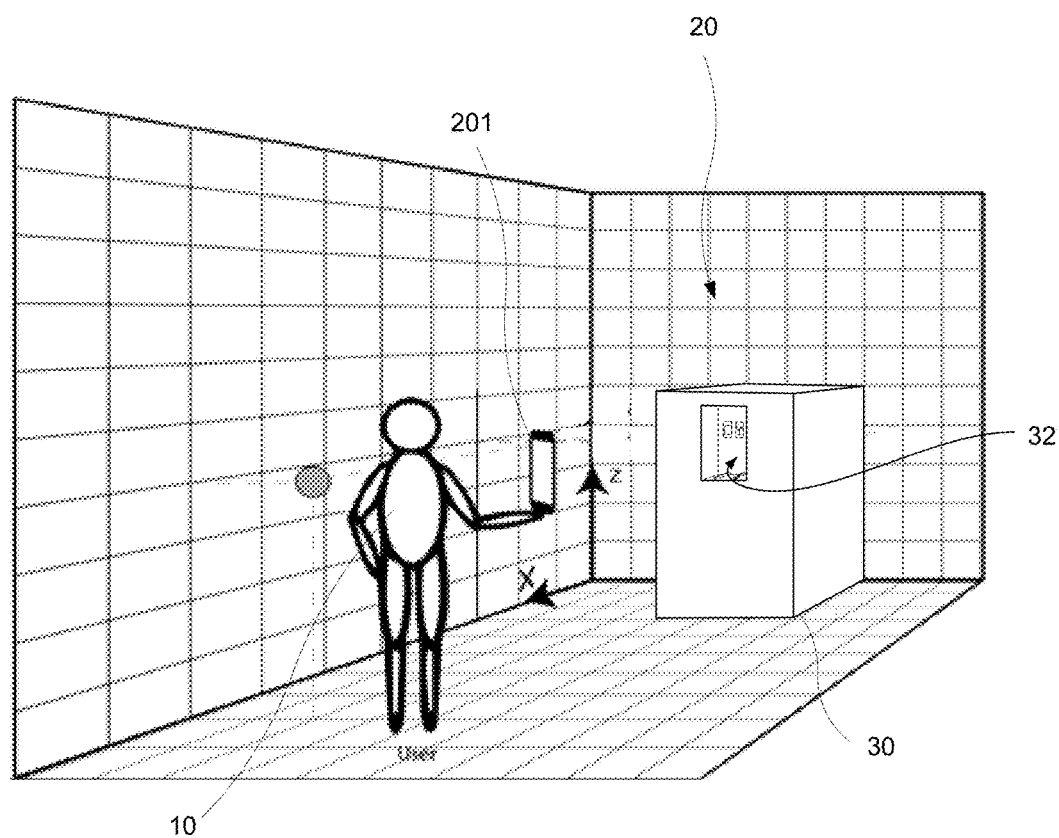
FIG. 5 is an illustration of a mobile interface device user in an area having electrical system equipment disposed therein.
Figure 6:
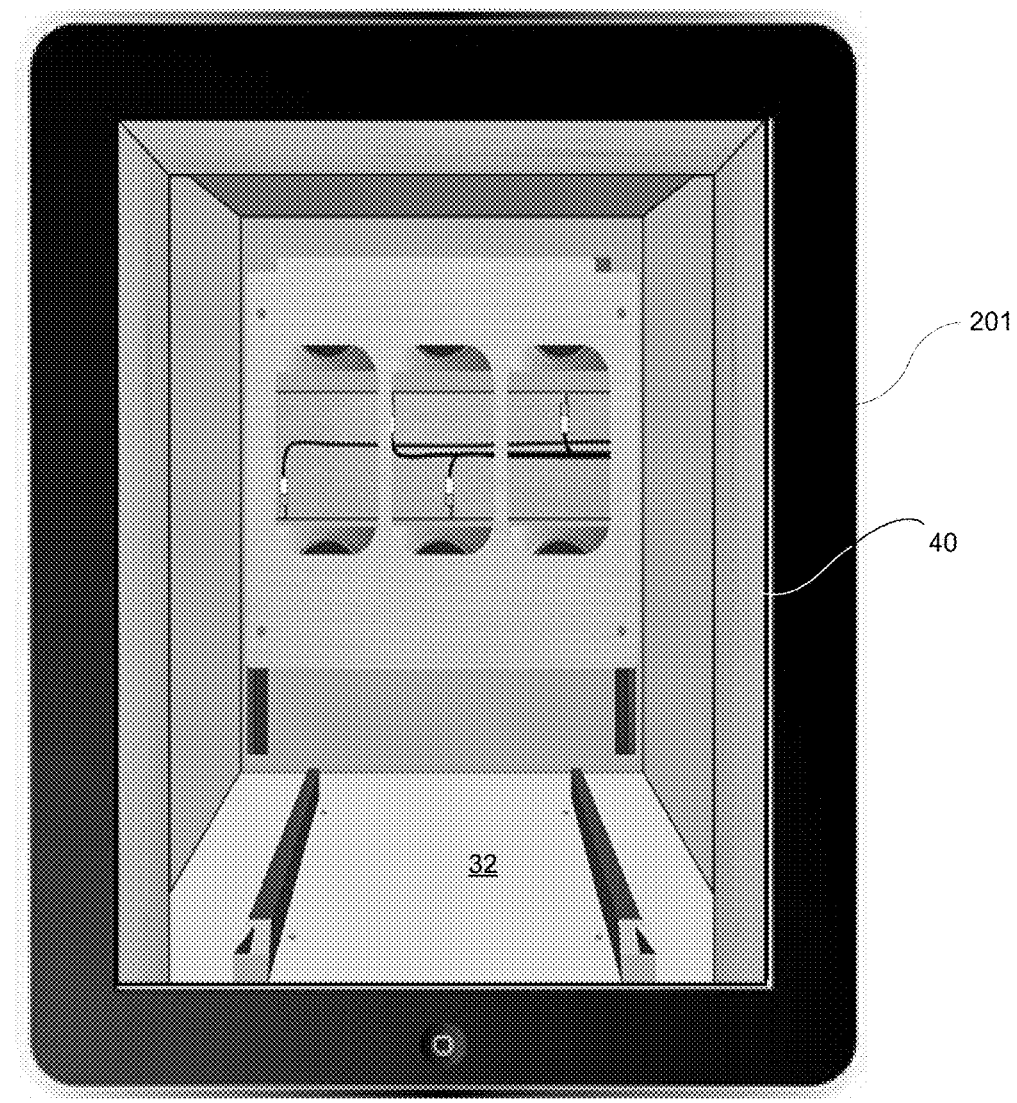
FIG. 6 is an illustration of an exemplary display of an image of an electrical equipment cubicle on a mobile interface device in accordance with an embodiment of the invention.

With reference to FIGS. 4 and 5, a method M200 may be conducted using the electrical system status display system 200 to provide electrical system status information to a mobile device user 10. The method begins at S205. At S210, the user uses the mobile interface device 201 to capture a digital image of a portion 20 of an environment in which electrical equipment such as switchgear cubicle 30 may be disposed (referred to herein as the target environment or target area). FIG. 6 illustrates an exemplary image 40 displayed on a mobile device 201. The image 40 shows the interior space 32 of the cubicle 30 (with breaker module removed) and the electrical components disposed therein. At S220, a request for electrical status information is sent from the mobile interface device 201 to a central processor 210 over a network 202. The request includes information usable by the central processor 210 to determine the exact location and pose of the mobile interface device 201 with respect to the local environment space and/or the target area. The space could be, for example, a room or other space inside a vessel or building or any other area where electrical equipment may be disposed. The target area may also be or include the interior of a particular cubicle, cabinet or housing. The information sent from the mobile interface device 201 may include some or all of the captured digital image. At S230, the central processor 210 uses the request information along with information from the local positioning system 209 to establish the exact location and pose of the mobile interface device 201 relative to the target area 20.

At S240, status information associated with one or more electrical systems or components within the target area 20 is obtained from an associated electrical status network. the status information may include energization, voltage, current or other system parameters at or across any of various components, busses or circuitry within the electrical system. The information may be obtained during or prior to the target area visualization process. At S250, the electrical system status and spatial information may be used as inputs to a computational component or simulation engine that will output the status of particular system parameters. The simulation engine may use simulation-based computational engineering and visualization software. If computation is not necessary (e.g., when status information can be displayed directly), S250 is not required.

It will be understood that the action of determining electrical system parameter status may be conducted by a processor of the electrical status network 203 or the central processor 210 or may be conducted in part by a processor of the electrical status network 203 and in part by the central processor 210.

In preferred embodiments, electrical system status information is available in real time so that actual live parameter levels can be provided to the mobile device user 10. In some instances, however, such live readings may be unavailable. In such instances, the parameter status may be based on previous information.

At S260 a rendering engine on the central processor 210 uses data received (discretely or continuously) from the simulation engine or directly from the electrical status network 203 along with mobile device pose information to construct an AR representation of the electrical environment for the target area 20. In preferred embodiments, this includes graphically rendering a visual display that can be superimposed over the view of the target area 20 captured by the mobile interface device 201. This rendering could include, for example, textual/numerical information or graphical information positioned so as to be readily associable with a component or node appearing in the captured view of the target area. The displayed information may include specific parameter values for system components in the viewed target area. It may also include component or test identification information, on-off status information, or task instructions for the user 10. In some cases the user may be presented with instructional training scenarios including an augmented representation of test points and graphical steps to follow when performing cubicle testing. At S270, AR electrical status information, which is or includes the AR graphical rendering constructed in S260, is transmitted to the mobile interface device 201. At S280, some or all of the AR electrical status information is displayed on the mobile interface device 201. The method M200 ends at S295.

Figure 7:
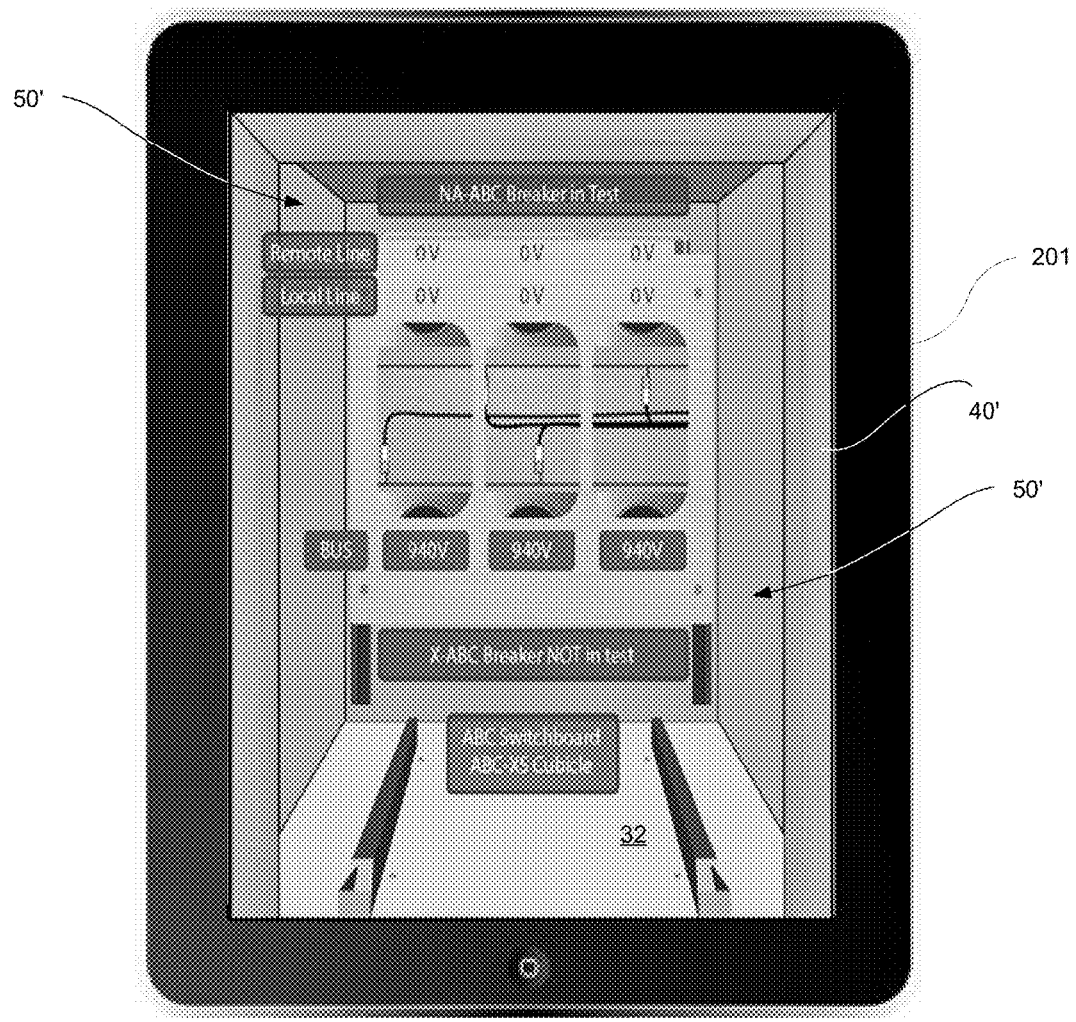
FIG. 7 is an illustration of an exemplary display of AR electrical system status information superimposed on an image of an electrical equipment cubicle on a mobile interface device in accordance with an embodiment of the invention.
Figure 8:
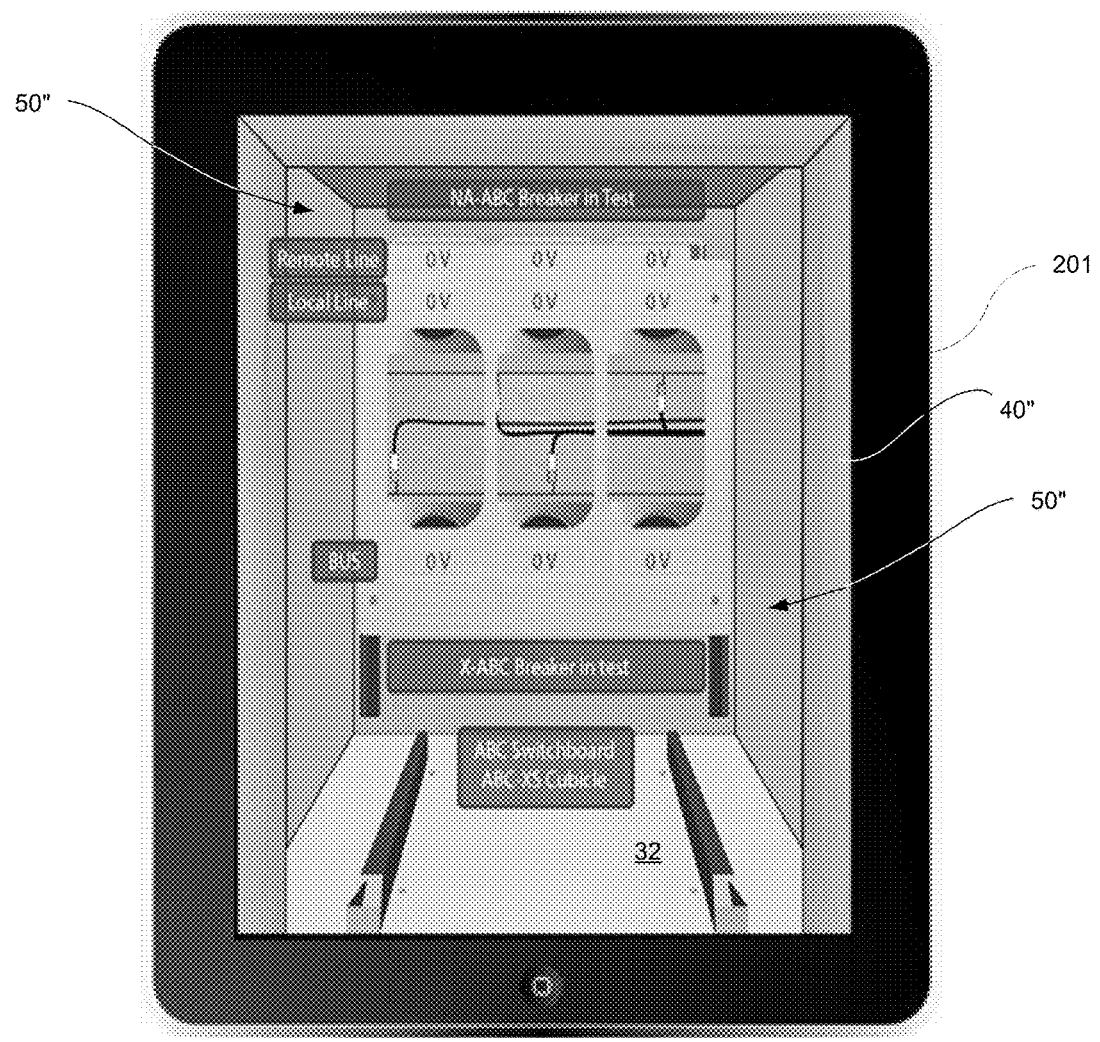
FIG. 8 is an illustration of an exemplary display of AR electrical system status information superimposed on an image of an electrical equipment cubicle on a mobile interface device in accordance with an embodiment of the invention.

In preferred embodiments, when the graphical AR rendering of the electrical status information is displayed on the mobile device 201, it is superimposed over the displayed image of the target area 20 so that the user 10 is able to see the status information for system components throughout the target area 20 or in specific portions of the target area 20. FIG. 7 illustrates the device 201 of FIG. 6 displaying image 40', which is the same view of the cubicle interior 32 as in FIG. 6, but with the AR status information 50' superimposed over the real-time camera image. In FIG. 7, the AR information 50' indicates that the circuits including the illustrated busses are energized with each buss at 940 V. FIG. 8 illustrates the device 201 displaying image 40" of the same cubicle interior 32 after the circuits have been de-energized. Now, the AR information 50" shows a zero voltage for each buss. In some embodiments (as in the illustrated example) different aspects of the information may be displayed in different colors or may change color when its status changes. For example, when the circuit is energized the voltage reading may be surrounded by a shaded box of a particular color (e.g., red, to indicate danger) which changes or disappears when the reading is zero.

It will be understood that, once requested, some or all of the actions of the method M200 may be repeated to periodically or continuously provide real-time environment information to the mobile interface device 201. This assures that the user 10 is aware of variations in the environment due to changes in conditions including but not limited to: the user's location, the overall structural environment, changes occurring in the electrical systems being monitored, or combinations of the foregoing.

The present invention may utilize any of the aforementioned or other methods available for providing electrical status information to a worker performing testing in an electrical environment including but not limited to a live reading of the current electrical system status parameters which provides the user with a visualized onsite electrical system safety rendering and/or gives the worker a prescribed approach to executing an electrical testing process, safely.

There are no known methods which provide workers with a visualized real-time situational awareness of electrical status parameters where there is no display instrumentation during the process of testing and operating of switchgear equipment. The present invention is intended to make the presence of electrical status not only perceivable to human operators, but properly displayed relative to their spatial location. The present invention thus solves the visualization problem as well as other shortcomings of the prior art.

As has been discussed, while the systems and methods of the present invention have a particular value when applied to vessels and other mobile structures, they may also be applied to stationary buildings and other structures as well. In stationary environments, GPS and GIS information are typically available and may be used by the operating system. The invention is, however, of particular utility in shipboard or other mobile/dynamic environments in which GPS information may be unreliable or unavailable. As has also been discussed, the present invention also addresses the problem of dynamic changes in structure and relative positioning such as are often encountered in large vessels. It will be understood that in some embodiments, the invention may be usable in a setting in which the user is not inside a structure and that the term "structural environment" may encompass exterior structural settings.

It will be readily understood by those persons skilled in the art that the present invention is susceptible to broad utility and application. Many embodiments and adaptations of the present invention other than those herein described, as well as many variations, modifications and equivalent arrangements, will be apparent from or reasonably suggested by the present invention and foregoing description thereof, without departing from the substance or scope of the invention.

What is claimed is:

1. A method for providing electrical system status information to a mobile interface device user in a dynamic structural environment in the form of a flexible structure having an associated environment coordinate system, the method comprising:
  receiving on a central data processor over a communication network from a mobile interface device disposed within the flexible structure a request for target area electrical system status information, the request including request information usable by the central data processor to determine the pose of the mobile interface device relative to a target area within the flexible structure;
  receiving mobile interface device location information from a local positioning system of the flexible structure, said location information being provided using the environment coordinate system;
  determining the pose of the mobile interface device relative to the target area using the request information and the mobile interface device location information;
  obtaining target area electrical system status information for a target electrical-component at least partially disposed within the target area, the target electrical component being a part of an electrical circuit;
  assembling augmented reality (AR) electrical system status information for transmission to and display on the mobile interface device, the AR electrical system status information being assembled using the target area electrical system status information and being configured for viewing in conjunction with a real-time view of the target area captured by the mobile interface device; and
  transmitting the AR electrical system status information to the mobile interface device,
  wherein the action of determining the pose of the requesting mobile interface device accounts for spatial changes in the environment coordinate system resulting from flexing of the flexible structure.

2. The method according to claim 1, wherein the mobile interface device is one of the set consisting of a tablet computer, a smartphone, and a wearable heads-up display.

3. The method according to claim 1 wherein the request for target area electrical system status information includes a digital image of the target area captured by the mobile interface device.

4. The method according to claim 3 wherein the action of determining includes:
  receiving mobile interface device location information from a local positioning system, said location information being provided in the environment coordinate system associated with the dynamic structure; and
  using the location information and the digital image to determine the pose of the mobile interface device.

5. The method according to claim 3 wherein the action of obtaining target area electrical system status information includes:
  receiving electrical parameter information for the electrical circuit-from one or more monitoring devices associated with the-electrical circuit, the electrical parameter information including the real-time value for the at least one of the set consisting of energization state, voltage, and current.

6. The method according to claim 5 wherein the AR electrical system status information includes the electrical parameter information and is configured so that when viewed in conjunction with the real-time view of the target area captured by the mobile interface device, the electrical parameter information is displayed adjacent said target electrical component in the captured real-time view.

7. A method according to claim 5 wherein the electrical system status information includes a real-time value for at least one of the set consisting of energization state, voltage, and current for at least a portion of the electrical circuit.

8. The method according to claim 5 wherein the target electrical component is or includes a circuit breaker buss.

9. The method according to claim 1 wherein the actions of determining, obtaining, assembling and transmitting are periodically repeated.

10. An automated system for providing electrical system status information to a mobile interface device in a dynamic structural environment in the form of a flexible structure having an associated environment coordinate system, the system comprising:
  at least one mobile interface device configured for variable disposition within the flexible structure, capturing information about a target environment within the flexible structure, and transmitting the target area information over a network;
  a domain coordinate management system comprising one or more data processors configured for receiving information on a current conformation of the flexible structure and resolving spatial differences in the environment coordinate system between the current conformation of the flexible structure and a stored model of the flexible structure dynamic structural environment;
  a local positioning system disposed at least partially within the flexible structure, the local positioning system being in communication with the at least one mobile interface device via the network and being configured to provide location information usable to determine a mobile interface device pose, said mobile interface device pose comprising a position and orientation of the mobile interface device relative to the target area in the environment coordinate system; and
  a central processor comprising at least one data processing machine in communication with the at least one mobile interface device and the local positioning system via the network, the central processor being configured for
    receiving from a requesting one of the at least one mobile interface device a request for target area electrical system information, the request including information usable to determine the pose of the requesting mobile interface device relative to the target area,
    determining the pose of the requesting mobile interface device relative to the target area accounting for spatial changes in the environment coordinate system due to flexing of the flexible structure, obtaining target area electrical status information for a target electrical components at least partially disposed within the target area, the target electrical component being a part of an electrical circuit, assembling augmented reality (AR) electrical system status information for transmission to and display on the requesting mobile interface device, the AR electrical system status information being assembled using the target area electrical status information and being configured for viewing in conjunction with a real-time view of the target area captured by the requesting mobile interface device, and transmitting the AR electrical system status information to the requesting mobile interface device.

11. The system according to claim 10 further comprising:

at least one electrical status network comprising one or more monitoring devices associated with the electrical circuit and being at least partially disposed within the target area, the monitoring devices being configured for determining an electrical parameter status for one or more electrical system components.

12. The system according to claim 10 wherein the target electrical component is or includes at least one protective relay.

* * * * *